United States Patent
Jung (10) Patent No.: US 7,176,518 B2
(45) Date of Patent: Feb. 13, 2007

(54) NONVOLATILE FLASH MEMORY DEVICE

(75) Inventor: Jin Hyo Jung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 106 days.

(21) Appl. No.: 11/024,438

(22) Filed: Dec. 30, 2004

(65) Prior Publication Data

US 2005/0151204 A1 Jul. 14, 2005

(30) Foreign Application Priority Data

Dec. 31, 2003 (KR) .................. 10-2003-0101094

(51) Int. Cl.
*H01L 29/788* (2006.01)

(52) U.S. Cl. .................. 257/315; 257/316

(58) Field of Classification Search .......... 257/315, 257/316

See application file for complete search history.

(56) References Cited

U.S. PATENT DOCUMENTS

| 5,387,534 | A | 2/1995 | Prall |
| 5,877,523 | A * | 3/1999 | Liang et al. ............... 257/315 |
| 6,178,113 | B1 * | 1/2001 | Gonzalez et al. ...... 365/185.03 |
| 6,252,271 | B1 | 6/2001 | Gambino et al. |
| 6,359,807 | B1 * | 3/2002 | Ogura et al. ........... 365/185.18 |
| 6,462,375 | B1 * | 10/2002 | Wu .............................. 257/316 |
| 6,768,681 | B2 | 7/2004 | Kim |
| 2002/0086556 | A1 * | 7/2002 | Ahn et al. ................... 438/785 |
| 2005/0045942 | A1 * | 3/2005 | Jung .......................... 257/316 |
| 2005/0139897 | A1 * | 6/2005 | Jung .......................... 257/315 |
| 2005/0162884 | A1 * | 7/2005 | Jung .............................. 365/63 |

* cited by examiner

*Primary Examiner*—Andy Huynh
*Assistant Examiner*—Earl Taylor
(74) *Attorney, Agent, or Firm*—Finnegan, Henderson, Farabow, Garrett, & Dunner, L.L.P.

(57) ABSTRACT

A method of fabricating nonvolatile memory devices is disclosed. A nonvolatile memory device comprises: a polysilicon gate on a semiconductor substrate; a gate oxide layer between the polysilicon gate and the substrate; sidewall floating gates on the bottom of the lateral faces of the polysilicon gate; tunnel oxide layers between the sidewall floating gates and the substrate; block oxide layers between the polysilicon gate and the sidewall floating gates; sidewall spacers on the sidewalls of the polysilicon gate and the sidewall floating gates; source and drain extension regions on the substrate under the sidewall spacers; and source and drain regions adjacent to the source and drain extension regions.

6 Claims, 6 Drawing Sheets

NONVOLATILE FLASH MEMORY DEVICE

BACKGROUND OF THE INVENTION

1. Field of the Invention

The present invention relates generally to a nonvolatile memory device and, more particularly, to a nonvolatile memory device which has a multi-layer of block oxide layers to increase a coupling ratio instead of conventional oxide-nitride-oxide(hereinafter referred to as "ONO") structure.

2. Background of the Related Art

In general, there are two categories in semiconductor devices, namely, a volatile memory and a non-volatile memory. The volatile memory again includes a dynamic random access memory (hereinafter referred to as "DRAM") and a static DRAM (hereinafter referred to as "SDRAM"). One characteristic of the volatile memory is that data are maintained just while electric power is being applied. In other words, when power is turned off, the data in the volatile memory disappear. On the other hand, the non-volatile memory, mainly a ROM (Read Only Memory), can keep the data regardless of the application of electric power.

From the point of a view of the fabrication process, the non-volatile memory is divided into a floating gate type and a metal insulator semiconductor (hereinafter referred to as "MIS") type. The MIS type has doubly or triply deposited dielectric layers which comprise at least two kinds of dielectric materials.

The floating gate type stores data using potential wells, and is represented by an ETOX (Electrically erasable programmable read only memory Tunnel OXide) used in a flash EEPROM (Electrically Erasable Programmable Read Only Memory).

The MIS type performs the program operation using traps at a bulk dielectric layer, an interface between dielectric layers, and an interface between a dielectric layer and a semiconductor. A Metal/Silicon ONO Semiconductor (hereinafter referred to as "MONOS/SONOS") structure mainly used for the flash EEPROM is a representative MIS structure.

A conventional SONOS memory device comprises a tunnel oxide layer, a trap nitride layer and a block oxide layer on a P-type silicon substrate, and a gate deposited thereon.

In the SONOS memory device, a program operation is performed by fowler-nordheim (hereinafter referred to as "FN") tunneling or directly tunneling electrons so that the electrons are trapped at a predetermined site in the trap nitride layer, thereby increasing a threshold voltage. An erase operation also moves the electrons by various tunneling ways such as the FN tunneling, the direct tunneling, and trap assisted tunneling so that the electrons are withdrawn to the P-type silicon substrate, thereby decreasing the threshold voltage.

Because the conventional SONOS device has employed the tunneling method for both the program and erase operations as described above, the thickness of the tunnel oxide has to be at most about 20 Å to achieve an adequate program/erase operating speed. However, the thin thickness of the tunnel oxide may detrimentally affect the retention characteristic of the memory device. Thus, various methods have been provided to solve such a problem in the SONOS device. One known method is to thicken the tunnel oxide layer, employ a thermal electron injection to perform the program operation, and a hot hole injection to perform the erase operation, thereby improving the retention characteristic. However, the above-described method radically deteriorates the endurance characteristic of the SONOS device.

Figure 1:
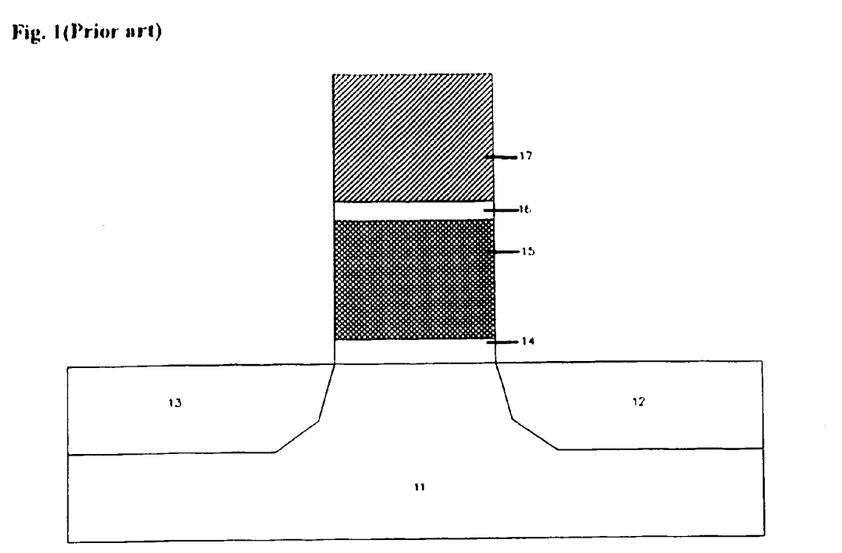
FIG. 1 is a cross-sectional view illustrating a conventional floating gate device of a single bit stack gate type.

FIG. 1 is a cross-sectional view illustrating a conventional floating gate of a single bit stack gate type.

Referring to FIG. 1, a tunneling oxide layer Comprising an $SiO_2$ layer 14 is formed on a P-type silicon substrate 11. A polysilicon floating gate 15 is formed on the tunneling oxide layer of the resulting structure. An oxide-nitride-oxide (hereinafter referred to as "ONO") layer 16 is formed to increase the coupling ratio. A control gate 17 is formed on the ONO layer 16. A source 13 and a drain 12 are then made adjacent to the both sides of the bottom of the $SiO_2$ layer 14.

Figure 2:
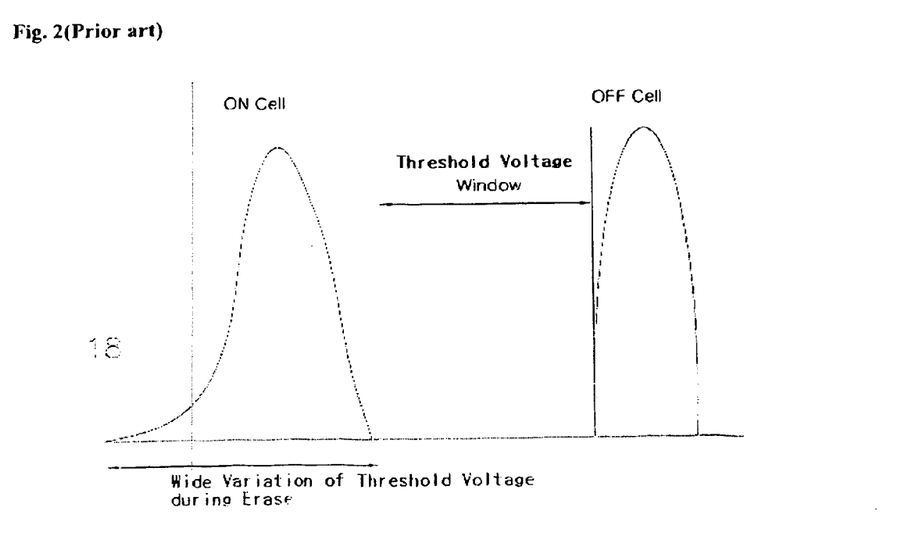
FIG. 2 is a graph illustrating the threshold voltage distribution of the program/erase operations of the conventional floating gate device of a single bit stack gate type.

FIG. 2 is a graph illustrating the threshold voltage distribution of the program/erase operations of the conventional floating gate of a single bit stack gate type.

Referring to FIG. 2, the threshold voltage of a cell 18 can become under 0[V] by an over-erase during the erase operation. In that case, the threshold distribution of the erase operation is wider than that of the program operation, thereby decreasing a threshold voltage window. In other words, even just one over-erased cell in the bit line may induct excessive current into the bit line and, therefore, interrupt reading data of other cells along the bit line. Such over-erase may be caused by various structural problems such as a critical dimension in the cell of the flash memory, the thickness of the tunneling oxide layer, a junction overlap, the critical dimension of the floating gate, unevenness of the surface of the floating gate, the thickness of the ONO layer, the damage of the tunneling oxide layer, locally thin tunneling oxide layer, and pin holes. A well-known conventional method for solving the over-erase problem comprises the steps of detecting an over-erased cell, and reprogramming the detected over-erased cell in order to increase the threshold voltage thereof.

However, detecting the over-erased cell is a time-consuming job and, additionally, complicated circuits are required to recover the detected over-erased cell. Moreover, the threshold voltage distribution during the erase operation is wide and affects the threshold voltage distribution of a later program operation. Consequently, the threshold voltage window decreases and a multi-level bit is difficult to achieve in accordance with the conventional art methods.

SUMMARY OF THE INVENTION

Accordingly, the present invention is directed to a nonvolatile memory device that substantially obviates one or more problems due to limitations and disadvantages of the related art.

An object of the present invention is to provide a nonvolatile flash memory cell which comprises 2 bit sidewall floating gate devices, making a threshold voltage of the memory cell converge to a certain value during the erase operation to prevent the over-erase of memory cell data.

Another object of the present invention is to provide a nonvolatile flash memory device by which it is easy to embody a multi-level bit cell.

To achieve these objects and other advantages and in accordance with the purpose of the invention, as embodied and broadly described herein, a nonvolatile memory comprises: a polysilicon gate on a semiconductor substrate; a gate oxide layer between the polysilicon gate and the substrate; sidewall floating gates on the bottom of the lateral faces of the polysilicon gate; tunnel oxide layers between the sidewall floating gates and the substrate; block oxide layers between the polysilicon gate and the sidewall floating gates; sidewall spacers on the sidewalls of the polysilicon gate and the sidewall floating gates; source and drain extension regions on the substrate under the sidewall spacers; and source and drain regions adjacent to the source and drain extension regions.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 3:
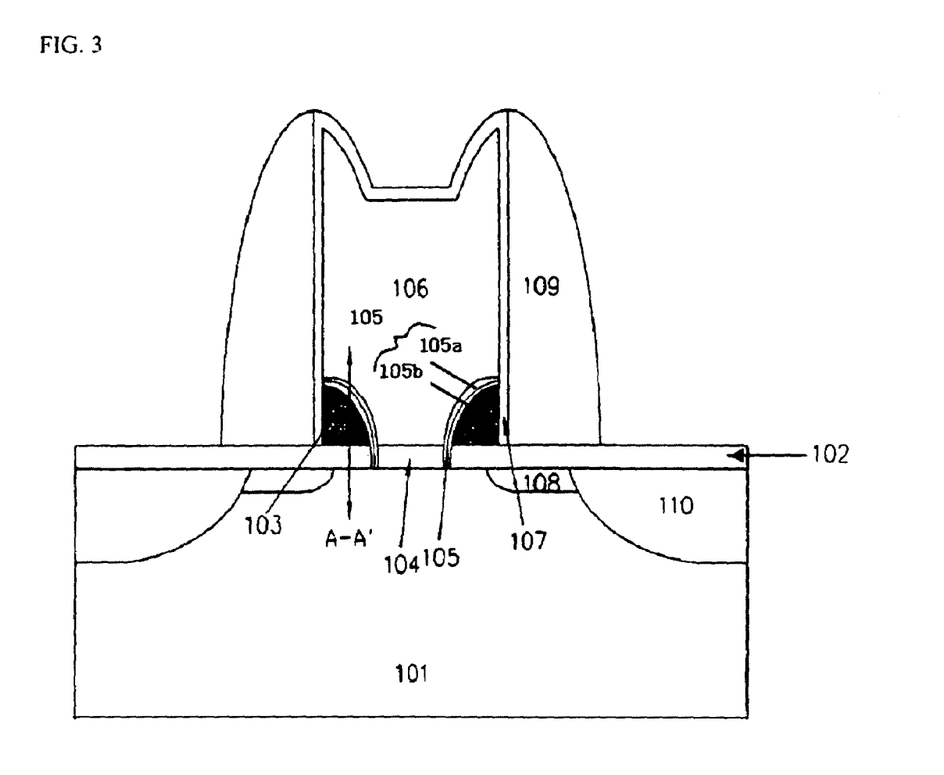
FIG. 3 is a cross-sectional view illustrating a nonvolatile memory device having a sidewall floating gate which can control two bits with one transistor in accordance with the present invention.

FIG. 3 is a cross-sectional view illustrating a non-volatile memory device having a sidewall floating gate which can control two bits with one transistor in accordance with the present invention.

Referring to FIG. 3, a gate oxide layer 104 is positioned on a semiconductor substrate 101 and a polysilicon gate 106 is positioned on the gate oxide layer 104. Sidewall floating gates 103 are placed on the bottom of the lateral faces of the polysilicon gate 106. Block oxide layers 105 are placed between the polysilicon gate 106 and the sidewall floating gates 103. The block oxide layer 105 comprise first block oxide layers 105a and second block oxide layers 105b. The first block oxide layers 105a are made of $Al_2O_3$ or $Y_2O_3$. The second block oxide layers 105b preferably are made of $SiO_2$. A tunnel oxide layer 102 is positioned between the sidewall floating gates 103 and the semiconductor substrate 101. The tunnel oxide layer 102 is made of $SiO_2$. Sidewall spacers 109 are placed on the lateral faces of the polysilicon gate 106 and the sidewall floating gates 103. Source and drain extension regions 108 are placed in the substrate under the sidewall spacers. Source and drain regions 110 are placed adjacent to the source and drain extension areas 108. The polysilicon gate 106 may be a 'T' shaped gate electrode, which means that the upper part of the polysilicon gate 106 is wider than the lower part of the polysilicon gate 106. In addition, a polysilicon oxide layer 107 is placed between the sidewall spacers 109 and the polysilicon gate 106, between the sidewall spacers 109 and the sidewall floating gates 103, and directly on top of the polysilicon gate 106.

According to FIG. 3, one transistor is capable of controlling two bits by changing potential walls of the surface of the semiconductor substrate 101 under the sidewall floating gates 103 by means of injecting electrons into or withdrawing electrons from the sidewall floating gates 103, which facilitates or obstructs the movement of electrons from the source to the drain.

Figure 4:
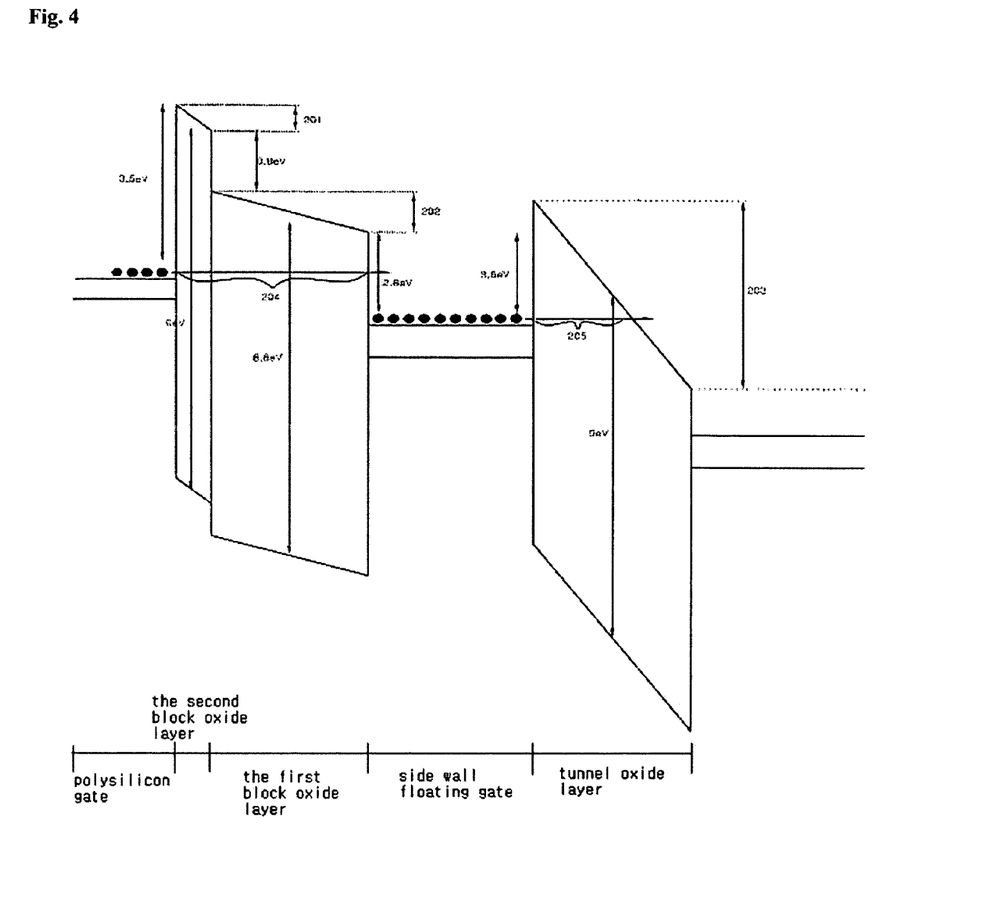
FIGS. 4 through 6 show erase changes of a nonvolatile memory device in energy band diagrams when a first block oxide layer is made of $Al_2O_3$ and a second block oxide layer is made of $SiO_2$.
Figure 5:
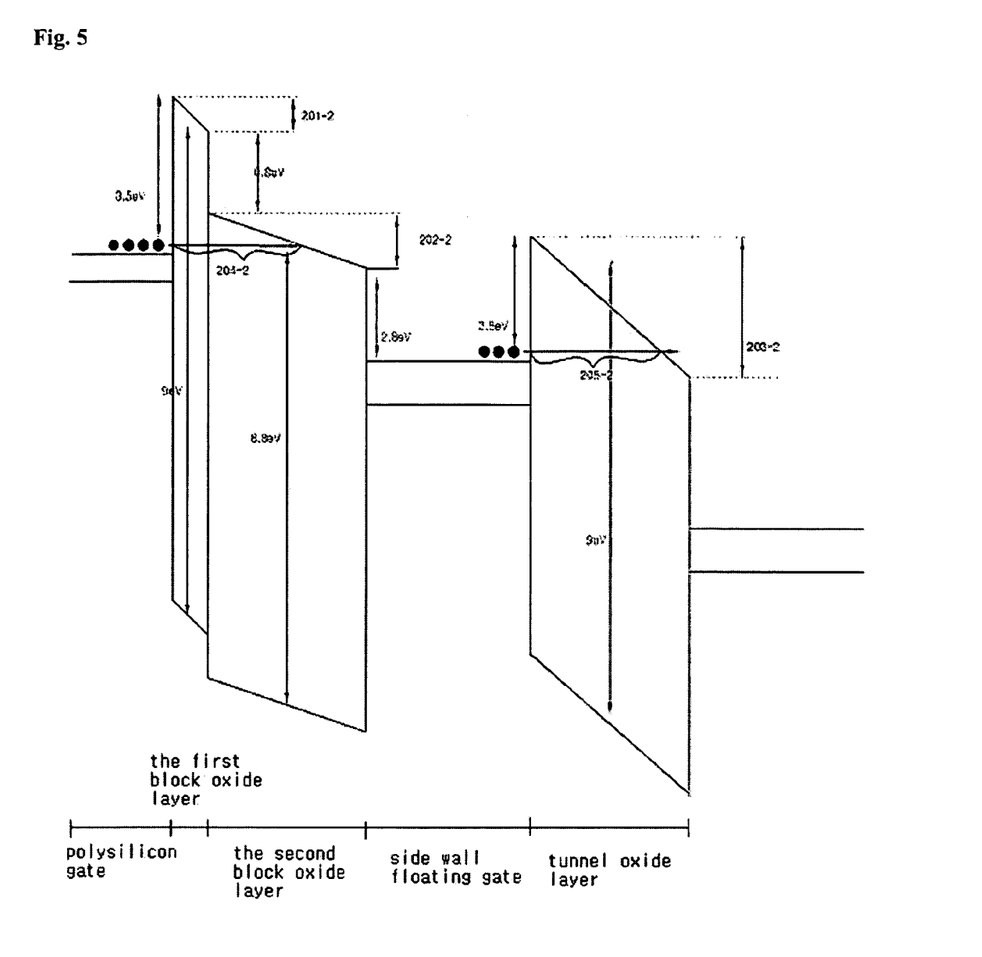
Figure 6:
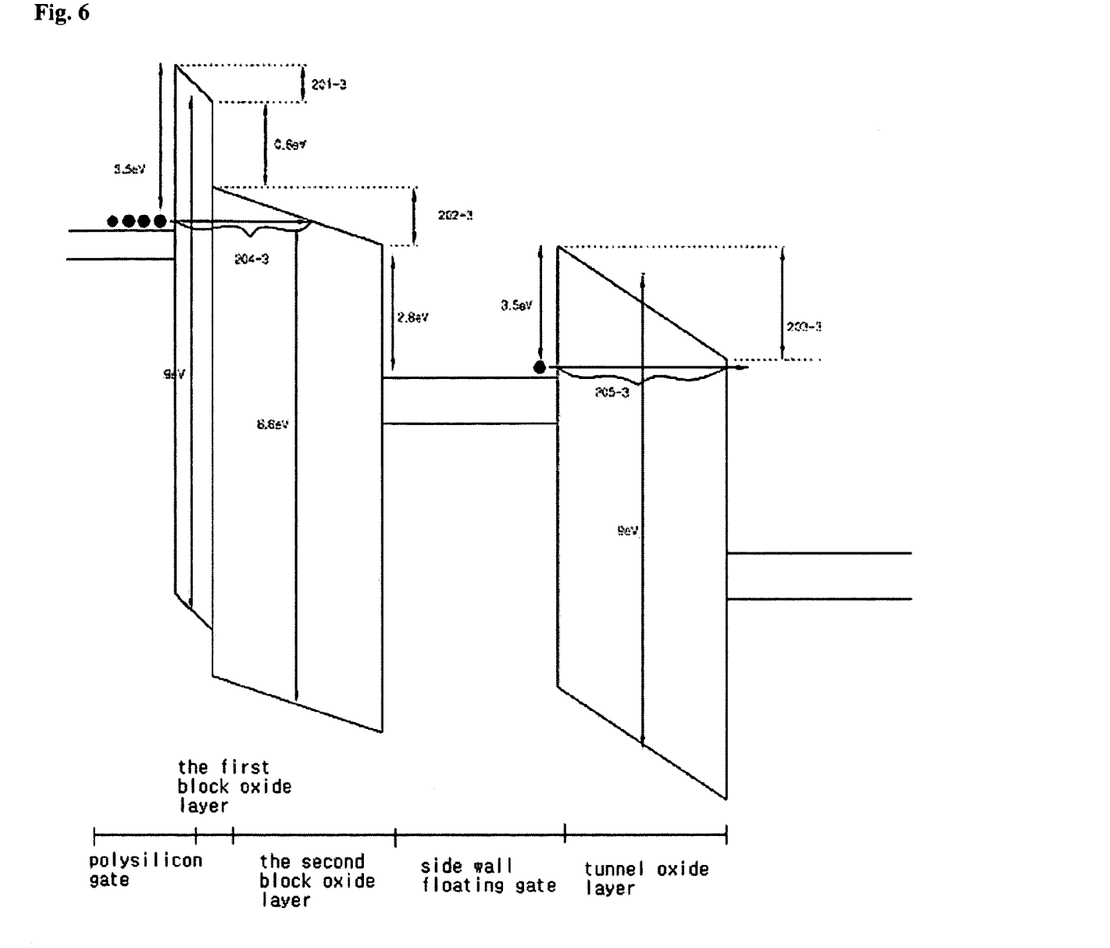

FIGS. 4 through 6 show erase changes of a nonvolatile memory device in energy band diagrams when the first block oxide layer 105a is made of $Al_2O_3$ and the second block oxide layer 105b is made of $SiO_2$.

FIG. 4 shows an energy band diagram at the early stage of an erase operation. In the erase operation, a high negative voltage is applied to the polysilicon gate, and a P-type substrate or a source/drain is earthed, or a negative voltage is applied to the polysilicon gate and a positive voltage is applied to the P-type substrate or the source/drain. These applied electric fields cause the conduction band energy level of the second block oxide layer, the first block oxide layer and the tunnel oxide layer to be inclined so that the first block oxide layer and the second block oxide layer have relatively weaker electric field than the tunnel oxide layer due to the electrons in the sidewall floating gates. Therefore, at the initial stage of the erase operation, the sum(201+202+0.8 eV) of two voltage drops, one 201 in the second block oxide layer and another 202 in the first block oxide layer, and a conduction band difference(0.8 eV) between the second block oxide layer and the first block oxide layer is smaller than the conduction band difference(3.5 eV) between the polysilicon gate and the second block oxide layer. Here, the electrons, which exist in the conduction band of the polysilicon gate, may be injected into the sidewall floating gates by means of the tunneling mechanism. However, because the tunneling length, which is equal to the thickness 204 of the first block oxide layer and the second block oxide layer, is too long, electrons are hardly injected from the polysilicon gate to the sidewall floating gates.

On the contrary, due to a strong electric field applied to the tunnel oxide layer, a high voltage drop 203 takes place for the tunnel oxide layer. The voltage drop is much higher than the conduction band difference(3.5 eV) between the sidewall floating gates and the tunnel oxide layer, so that the electrons accumulated in the conduction band of the sidewall floating gates are pulled out to the P-type substrate or the source/drain by the FN tunneling mechanism. Furthermore, the short length 205 for the FN tunneling helps the electrons to be easily pulled out from the sidewall floating gates to the P-type substrate or the source/drain. Consequently, a threshold voltage of the memory cell decreases at the early stage of the erase operation.

FIG. 5 shows an energy band diagram at the intermediate stage of the erase operation. As the erase operation proceeds, the number of the electrons accumulated in the sidewall floating gates decreases, so that the electric field applied to the tunnel oxide layer gradually becomes weak and the voltage drop 203-2 in the tunnel oxide layer is also getting smaller. On the other hand, the electric field of the first block oxide layer and the second block oxide layer are getting increased, so that both voltage drops, one 201-2 in the second block oxide layer and another 202-2 in the first block oxide layer, gradually become increased.

Therefore, the sum(201-2+202-2+0.8 eV) of two voltage drops, one 201-2 in the second block oxide layer and another 202-2 in the first block oxide layer, and the conduction band difference(0.8 eV) between the second block oxide layer and the first block oxide layer is larger than the conduction band difference(3.5 eV) between the polysilicon gate and the second block oxide layer. Consequently, the electrons, which exist in the conduction band of the polysilicon gate, are injected into the conduction band of the sidewall floating gates by means of a modified FN(hereinafter referred to as "MFN") tunneling mechanism. Here, the length 204-2, through which the electrons are moving from the conduction band of the polysilicon gate to the sidewall floating gates by means of the MFN tunneling mechanism, corresponds to the sum of the whole thickness of the second block oxide layer and the FN tunneling length of the first block oxide layer. However, the MFN tunneling length 204-2 of electrons from the polysilicon gate to the sidewall floating gates is longer than the FN tunneling length from the sidewall floating gates to the P-type substrate or the source/drain, so that electrons are still pulled out to the P-type substrate or the source/drain rather than to the sidewall floating gates. As a result, a threshold voltage of the memory device continues to decrease.

FIG. 6 shows an energy band diagram at the late stage of the erase operation. Because most electrons accumulated in the sidewall floating gates have been pulled out to the P-type substrate or the source/drain, there may be few or no more electrons left, or, reversely, holes may be in the sidewall floating gates, injected from the P-type substrate or the source/drain. At this late stage of the erase operation, the electric field applied to the tunnel oxide layer has a minimum value, so that the voltage drop 203-3 in the tunnel oxide layer is minimized. On the other hand, as the electric field in the first block oxide layer and the second-block oxide layer has a maximum value, both voltage drops, one 201-3 in the second block oxide layer and another 202-3 in the first block oxide layer, are maximized. Therefore, the sum(201-3+202-3+0.8 eV) of two voltage drops, one 201-3 in the second block oxide layer and another 202-3 in the first block oxide layer, and the conduction band difference(0.8 eV) between the second block oxide layer and the first block oxide layer is larger than the conduction band difference(3.5 eV) between the polysilicon gate and the second block oxide layer. Consequently, the electrons, which exist in the conduction band of the polysilicon gate, are injected into the conduction band of the sidewall floating gates by means of the MFN tunneling mechanism. Here, the MFN tunneling length 204-3, from the conduction band of the polysilicon gate to the sidewall floating gates, corresponds to the sum of the whole thickness of the second block oxide layer and the FN tunneling length of the first block oxide layer.

At the late stage of the erase operation, the MFN tunneling length 204-3 becomes close to the tunneling length 205-3 from the sidewall floating gates to the P-type substrate or the source/drain. Thus, the electrons, as many as electrons pulled out from the sidewall floating gates to the P-type substrate or the source/drain, or holes injected from the P-type substrate or the source/drain to the sidewall floating gates, are injected from the polysilicon gate to the sidewall floating gates. Consequently, even if the erase operation lasts longer, the threshold voltage in the erase operation converges to a certain value. The thicknesses of the first block oxide layer, the second block oxide layer and the tunnel oxide layer are determined by the convergence level of the threshold voltage in the erase operation.

Figure 7:
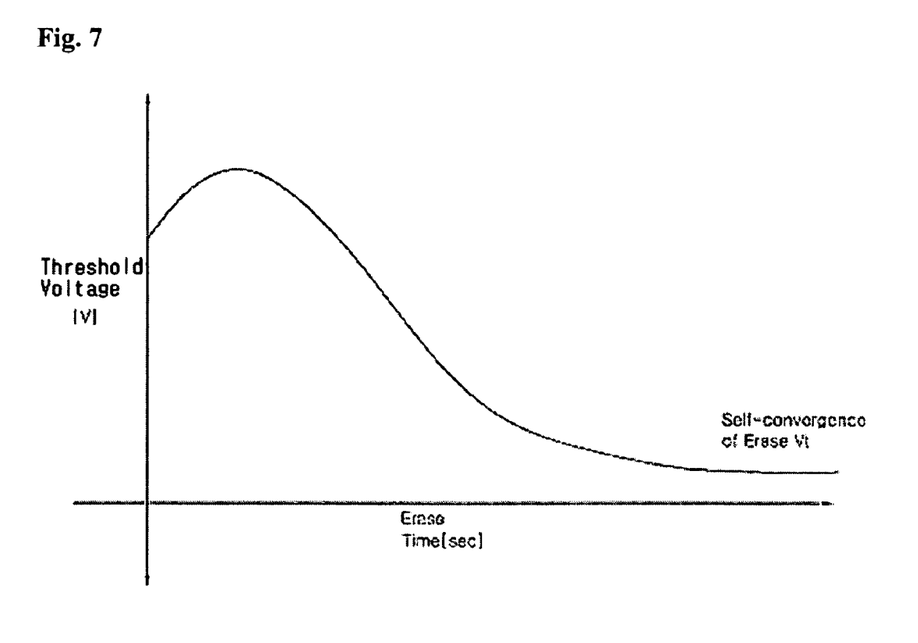
FIG. 7 shows an erase characteristic of a nonvolatile memory device in accordance with the present invention.

FIG. 7 shows an erase characteristic of a nonvolatile memory device in accordance with the present invention.

Referring to FIG. 7, it shows that as the erase operation time elapses, the threshold voltage decreases and, at the late stage, converges to a certain value.

Accordingly, the disclosed methods embody a nonvolatile memory device having a first block oxide layer and a second oxide layer instead of conventional flash memory cells comprising single bit stack gates having ONO structure, so that electrons are injected from the polysilicon gate to the sidewall floating gates through MFN tunneling mechanism at the late stage of the erase. This makes up for electrons as many as the electrons pulled out from the sidewall floating gates to the P-type substrate or the source/drain, or the holes injected from the P-type substrate or the source/drain to the sidewall floating gates. Thus, the threshold voltage in the erase operation converges to a certain value. After all, this feature prevents the over-erase of memory cell data and narrows the threshold voltage distribution, solving the problem that the threshold voltage window (i.e., $V_t$ window) reduces due to an wide variation of the erase threshold voltage. Moreover, if the erase threshold voltage have a small variation at a predetermined voltage level, the threshold voltage distribution for the program operation also becomes narrow, so that multi-level bit cells may be easily embodied. In addition, because dielectric constants of $Al_2O_3$ and $Y_2O_3$(9 and 17 respectively) used as a first block oxide layer are bigger than that of silicon nitride (7.5), a higher coupling ratio is accomplished by using the first block oxide layer and the second block oxide layer instead of ONO structure. This can effectively reduce a voltage applied to a control gate.

It is noted that this patent claims priority from Korean Patent Application Serial Number 10-2003-0101094, which was field on Dec. 31, 2003, and is hereby incorporated by reference in its entirety.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A nonvolatile memory device comprising:
   a polysilicon gate on a semiconductor substrate, the polysilicon gate having lateral faces;
   a gate oxide layer between the polysilicon gate and the substrate;
   sidewall floating gates on the bottom of the lateral faces of the polysilicon gate;
   tunnel oxide layers between the sidewall floating gates and the substrate;
   block oxide layers between the polysilicon gate and the sidewall floating gates, the block oxide layers also being between the gate oxide layer and the tunnel oxide layer;
   sidewall spacers on the sidewalls of the polysilicon gate and the sidewall floating gates;
   a polysilicon oxide layer covering a top and side of the polysilicon gate and a side of the sidewall floating gates, the polysilicon oxide layer being between the sidewall spacers and the polysilicon gate and the sidewall floating gates;
   source and drain extension regions in the substrate under the sidewall spacers; and
   source and drain regions adjacent to the source and drain extension regions.

2. The device of claim 1, further comprising a polysilicon oxide layer between the sidewall spacers and the polysilicon gate, and between the sidewall spacers and the sidewall floating gates.

3. The device of claim 1, wherein the polysilicon gate comprises an upper part and a lower part, and the upper part is wider than the lower part.

4. The device of claim 1, wherein the block oxide layers comprise a first block oxide layer and a second block oxide layer.

5. The device of claim 4, wherein the first block oxide layer is made of $Al_2O_3$ or $Y_2O_3$ with a thickness between 50 Å and 250Å.

6. The device of claim 4, wherein the second block oxide layer is made of $SiO_2$ with a thickness between 20 Å and 150Å.

* * * * *